(12) United States Patent
Kim et al.

(10) Patent No.: US 10,097,155 B2
(45) Date of Patent: Oct. 9, 2018

(54) POWER DIVIDER

(71) Applicants: Hyundai Motor Company, Seoul (KR); Kia Motors Corporation, Seoul (KR)

(72) Inventors: Byungguk Kim, Gyeonggi-do (KR); Hyeonje Son, Gyeonggi-do (KR); Jungook Lee, Gyeonggi-do (KR); Yong Ho Kim, Gyeonggi-do (KR); JaeHwan Kwon, Gyeonggi-do (KR); JangYeol Kim, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 15/333,434

(22) Filed: Oct. 25, 2016

(65) Prior Publication Data

US 2017/0214380 A1    Jul. 27, 2017

(30) Foreign Application Priority Data

Jan. 25, 2016    (KR) .......................... 10-2016-0008788

(51) Int. Cl.
*H03H 7/48* (2006.01)
(52) U.S. Cl.
CPC ..................... *H03H 7/48* (2013.01)
(58) Field of Classification Search
CPC ............ H03H 7/48; H03H 7/482; H03H 7/46; H03H 7/461; H01P 5/12; H01P 1/213
See application file for complete search history.

(56) References Cited

U.S. PATENT DOCUMENTS

2007/0127368 A1*  6/2007  Shimizu .................. H03H 7/48
                                                             370/226

FOREIGN PATENT DOCUMENTS

| JP | H05327568 A | 12/1993 |
| JP | H06194438 A | 7/1994 |
| JP | H10512612 A | 12/1998 |
| JP | 2000-227987 A | 8/2000 |
| JP | 2015-184049 A | 10/2015 |
| KR | 2003-60591 Y1 | 8/2004 |
| KR | 2006-0104865 A | 10/2006 |
| KR | 2011-0040557 A | 4/2011 |

OTHER PUBLICATIONS

Korean Notice of Allowance for Korean Patent Application No. 10-2015-0038477, dated Dec. 6, 2016, English Abstract.

* cited by examiner

*Primary Examiner* — Robert J Pascal
*Assistant Examiner* — Kimberly Glenn
(74) *Attorney, Agent, or Firm* — Mintz Levin Cohn Ferris Glovsky and Popeo, P.C.; Peter F. Corless

(57) ABSTRACT

A power divider is provided with a structure that diagnoses whether a correct connection is achieved. The power divider includes a first line that is configured to connect an antenna to a first unit and a second line that is configured to connect the antenna to a second unit. A resistor is configured to allow a current flowing from the second unit to the second line to be applied to a ground terminal. Additionally, a capacitor is disposed on the second line to prevent the current applied to the second line from flowing to the first line.

7 Claims, 11 Drawing Sheets

POWER DIVIDER

CROSS-REFERENCE TO RELATED APPLICATION

This application claims the benefit of Korean Patent Application No. 10-2016-0008788, filed on Jan. 25, 2016 in the Korean Intellectual Property Office, the disclosure of which is incorporated herein by reference.

BACKGROUND

1. Field of the Disclosure

The present disclosure relates to a power divider, and more particularly, to a power divider that distributes one or more signals received via an input terminal to a plurality of output terminals.

2. Description of the Related Art

A power divider (also referred to as a power splitter) has been configured to distribute at least one input signal to a plurality of output terminals. When a certain power divider in which N output terminals are allocated to one input terminal is constructed, this power divider is referred to as an N-way distributor. Power dividers are classified into a uniform-distribution-type power divider configured to equally distribute the input signal to respective output terminals and a differential-distribution-type power divider configured to distribute different sizes of input signals to the respective output terminals.

For example, an input terminal of the power divider may be connected to an antenna to receive a signal, and a plurality of devices configured to operate by the signal received via the antenna may be connected to a plurality of output terminals of the power divider. When using a vehicle as an example, an antenna configured to receive a global positioning system (GPS) signal may be connected to the input terminal of the power divider, an emergency call originator and a multimedia device that are designed to operate by the GPS signal may be connected to the plurality of output terminals of the power divider.

Accordingly, there is a need to determine whether the antenna connected to the input terminal of the power divider and the devices connected to the output terminal of the power divider are correctly connected to the power divider to perform signal transmission is achieved among the antenna, the devices and the power divider. There is a need to perform connection diagnosis of the above-mentioned power divider not only in the developing and manufacturing processes of vehicles, but also in other vehicles sold to customers. The above-mentioned connection diagnosis of the power divider needs to be periodically performed not only in the manufacturing stage prior to the sales stage of vehicles to manufacture superior-quality vehicles, but also in the after-sales stage of vehicles to allow a user or owner of the vehicle to safely drive a vehicle from the viewpoint of maintenance of vehicles.

SUMMARY

Therefore, the present disclosure provides a power divider structure configured to diagnose whether correct connection is achieved. Additional aspects of the invention will be set forth in part in the description which follows and, in part, will be obvious from the description, or may be learned by practice of the invention.

In accordance with an exemplary embodiment of the present disclosure, a power divider may include a first line configured to connect an antenna to a first unit; a second line configured to connect the antenna to a second unit; a resistor configured to allow a current flowing from the second unit to the second line to be applied to a ground terminal; and a capacitor disposed on the second line to prevent the current applied to the second line from flowing to the first line. The power divider may further include an inductor connected in series to the resistor. The current may be a direct current (DC). The antenna may be configured to receive a global positioning system (GPS) signal. The first unit may be an emergency call origination unit and the second unit may be a multimedia unit.

In accordance with another exemplary embodiment of the present disclosure, a power divider may include: an input terminal connected to an antenna; a first output terminal connected to the input terminal via a first line to output a signal; a second output terminal connected to the input terminal via a second line to output the signal; a resistor configured to allow a current flowing to the second line via the second output terminal to be applied to a ground terminal; and a capacitor disposed on the second line to prevent the current applied to the second line from flowing to the first line, wherein the current may be applied to the first line via a first unit connected to the first output terminal to diagnose a connection state among the antenna, the first line, and the first unit; and the current may be applied to the second line via a second unit connected to the second output terminal to diagnose a connection state between the second line and the second unit. The power divider may further include: an inductor connected in series to the resistor. The current may be a direct current (DC). The antenna may be configured to receive a global positioning system (GPS) signal. The first unit may be an emergency call origination unit and the second unit may be a multimedia unit.

In accordance with another exemplary embodiment of the present disclosure, a power divider may include an input terminal connected to an antenna; a first output terminal connected to the input terminal via a first line to output a signal; a second output terminal connected to the input terminal via a second line to output the signal; a resistor configured to allow a current flowing to the second line via the second output terminal to be applied to a ground terminal; and an inductor connected in series to the resistor; a capacitor disposed on the second line to prevent the current applied to the second line from flowing to the first line, wherein the current may be applied to the first line via an emergency call origination unit connected to the first output terminal to diagnose a connection state among the antenna, the first line, and the emergency call origination unit; and the current may be applied to the second line via a multimedia unit connected to the second output terminal to diagnose a connection state between the second line and the multimedia unit.

In accordance with another exemplary embodiment of the present disclosure, a power divider may include an input terminal configured to receive a signal; a first output terminal connected to the input terminal through a first line to output the signal; a second output terminal connected to the input terminal via a second line to output the signal; a resistor configured to allow a current flowing to the second line via the second output terminal to be applied to a ground terminal; and a capacitor disposed on the second line to prevent the current applied to the second line from flowing to the first line. The power divider may further include: an inductor connected in series to the resistor.

BRIEF DESCRIPTION OF THE DRAWINGS

These and/or other aspects of the invention will become apparent and more readily appreciated from the following description of the exemplary embodiments, taken in conjunction with the accompanying drawings of which.

DETAILED DESCRIPTION

Figure 1:
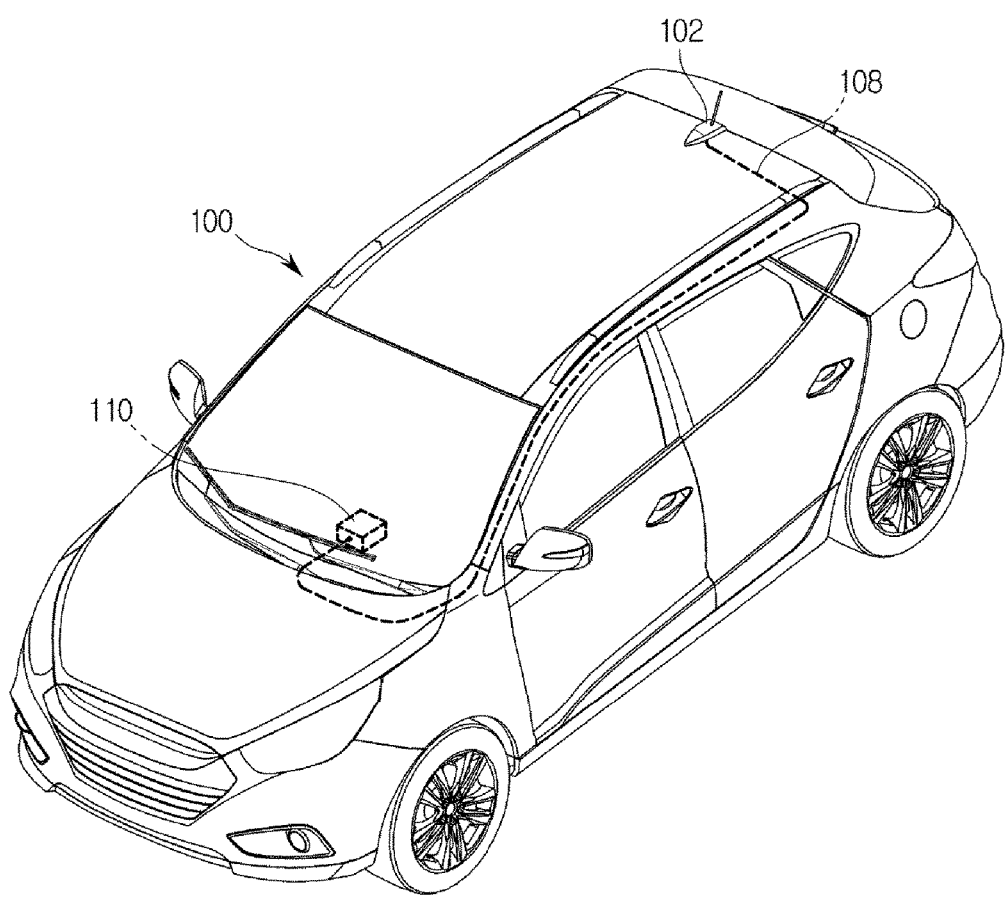
FIG. 1 is a view illustrating the appearance of an antenna installation structure of a vehicle according to an exemplary embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules. Additionally, it is understood that the term controller refers to a hardware device that includes a memory and a processor. The memory is configured to store the modules and the processor is specifically configured to execute said modules to perform one or more processes which are described further below.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Reference will now be made in detail to the exemplary embodiments of the present disclosure, examples of which are illustrated in the accompanying drawings, wherein like reference numerals refer to like elements throughout.

FIG. 1 is a view illustrating the appearance of an antenna installation structure of a vehicle according to an exemplary embodiment of the present disclosure. Referring to FIG. 1, an antenna 102 of a vehicle 100 may be fixed to a roof of the vehicle 100 and the antenna 102 may be connected to a power divider 110 installed in the vicinity of a driver's seat via a cable 108 for signal transmission. The cable 108 may be disposed in a lower space of the roof of the vehicle 100 and/or an inner space of a pillar of the vehicle 100. The antenna may be an antenna module including a low noise amplifier (LNA). The installation position of the integrated antenna and cable arrangement may be changed in consideration of the design of the vehicle 100 and transmission/reception (Tx/Rx) efficiency of signals.

Additionally, the power divider 110 may be configured to distribute signals received via the antenna 102 connected to the input terminal to a plurality of devices connected to the output terminals. A signal distribution scheme for use in the power divider 110 may be equal distribution or differential distribution. The power divider 110 for use in the vehicle 100 will hereinafter be described with reference to FIG. 2.

Figure 2:
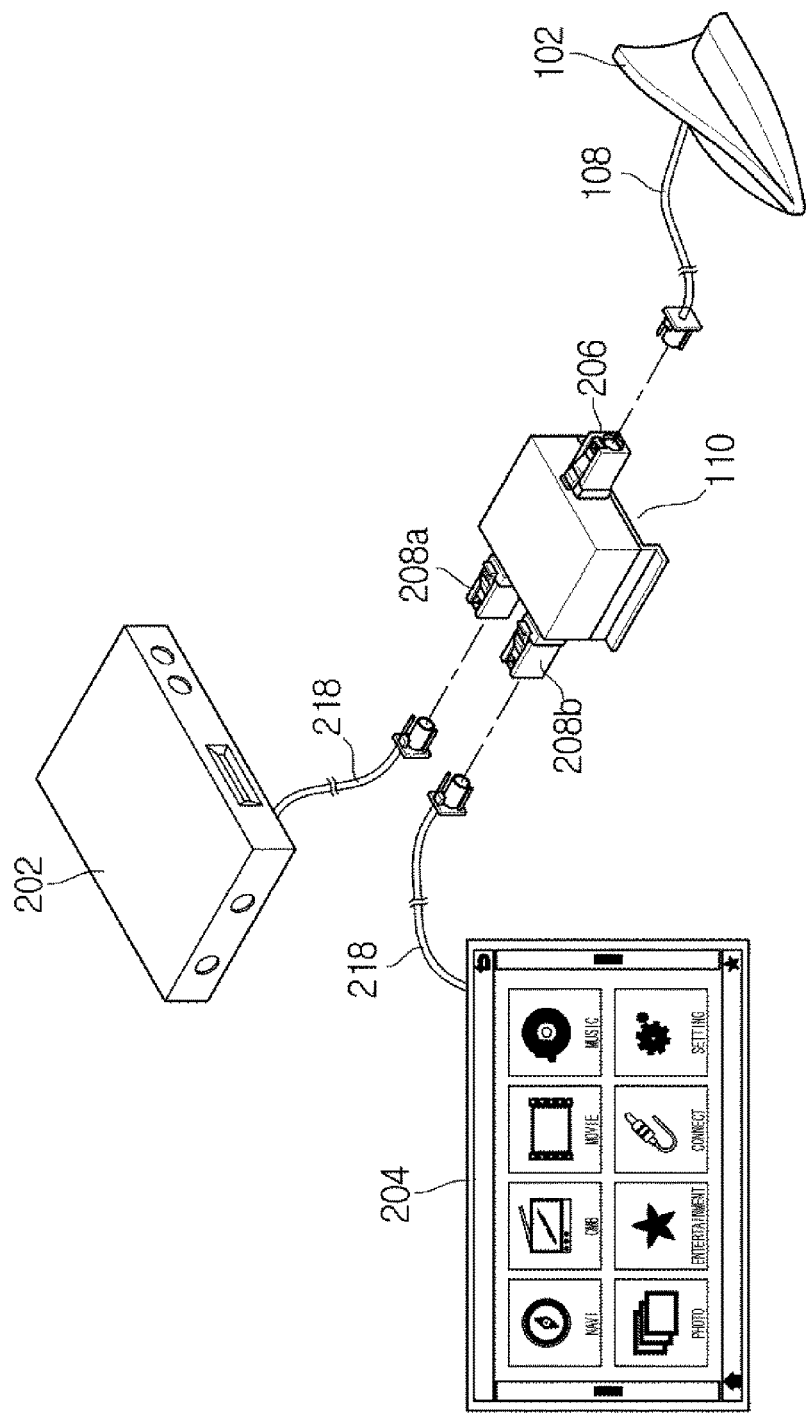
FIG. 2 is a conceptual diagram illustrating a power divider of the vehicle according to an exemplary embodiment of the present disclosure.

FIG. 2 is a conceptual diagram illustrating a power divider of a vehicle according to an exemplary embodiment of the present disclosure. FIG. 2 is a conceptual diagram illustrating the power divider 110 configured to distribute a signal received via one antenna 102 to two devices 202 and 204. In FIG. 2, the signal received via the antenna 102 may be a GPS signal (e.g., received via communication from a device within the vehicle). In addition, a first device 202 and a second device 204 may respectively be an emergency call originator 202 and an audio video navigation (AVN) unit 204.

The antenna 102 may be installed within the vehicle 100 to receive a signal (hereinafter referred to as a PS signal) received from a satellite constructing a global navigation satellite system (GNSS). The GPS signal received via the antenna 102 may be transferred to the input terminal 206 of the power divider 110. The power divider 110 may include one input terminal 206 and two output terminals (208a, 208b). Although FIG. 2 shows only two output terminals (208a, 208b) of the power divider 110 for convenience of description, it should be noted that three or more output terminals may also be applied to the power divider without departing from the scope or spirit of the present disclosure.

The input terminal 206 and the output terminals (208a, 208b) may be implemented as a Kafra connector. In other words, the input terminal 206 implemented as a Kafra jack and the output terminals (208a, 208b) may be fixed to a main body of the power divider 110, and a Kafra plug installed at one end of each cable 108 or 218 may be inserted into the Kafra jack of each of the input terminal 206 and the output terminal 208a or 208b to implement data communication between the input and output signals. A printed circuit board (PCB) (not shown) may be disposed within the main body of the power divider 110. A circuit configured to distribute a GPS signal applied to the input terminal 206 to two output terminals (208a, 208b) may be mounted to the PCB. The GPS signal received via the antenna 102 and distributed to the emergency call originator 202 and the AVN unit 204 after passing through the power divider 110 may be a radio frequency (RF) signal.

The emergency call originator 202 corresponding to one of the plurality of devices configured to receive the GPS signal distributed by the power divider 110 may be an emergency call originator for a vehicle in which an emergency situation occurs, such that, although an unexpected emergency situation of the vehicle 100 occurs, the emergency call originator 202 automatically transmits a rescue or SOS signal indicating the occurrence of the emergency situation. When a traffic accident of the vehicle 100 occurs, the emergency call originator 202 may be configured to detect the traffic accident due to inflation of an airbag mounted to the vehicle 100, automatically transmit an emergency call defined as any of emergency phone numbers (e.g., 911), to allow the police or rescue center to recognize the occurrence of the traffic accident or emergency situation. When the emergency call originator 202 does not automatically operate, the driver of the vehicle 100 may also directly manipulate the emergency call originator 202 to transmit the rescue or SOS signal to the police or rescue center.

As soon as the emergency call originator 202 units transmits or originates an emergency call, a subscriber identity module (SIM) card mounted to the vehicle 100 may automatically transmit a minimum set of data (MSD) to a competent rescue center located in the vicinity of the traffic accident occurrence position. The minimum set of data (MSD) may include various types of information, for example, the position of traffic accident, a vehicle type (e.g., sedan, SUV, etc.), a vehicle traveling direction, an emergency call origination method (e.g., automatic or manual), the type of vehicle fuel, and the number of seat belts used at the traffic accident occurrence time. Through the above-mentioned emergency call origination, an initial reaction time for dealing with the traffic accident may be reduced, resulting in reduction of life damage and social costs caused by various accidents.

The AVN unit 204 corresponding to the second of the plurality of devices configured to receive the GPS signal distributed by the power divider 110 may be a multimedia device configured to perform reproduction of audio/video (A/V) data and a navigation function. The AVN unit 204 may be configured to receive a signal from a car radio, and broadcast the received signal. In addition, the AVN unit 240 may be configured to perform Tx/Rx (transmission/reception) functions required for wireless communication by connecting to a wireless communication terminal.

The two devices (i.e., the emergency call originator 202 and the AVN unit 204) respectively connected to the output terminals 208a and 208b of the power divider 110 may be designed to commonly receive the GPS signal. Prior to transmitting a rescue signal to the rescue center, the emergency call originator 202 may be configured to detect the position of the vehicle 100 based on the received GPS signal to inform the rescue center of the position of the vehicle 100. The AVN unit 204 may use the GPS signal to detect a current position of the vehicle 100 to perform a navigation function. In addition, to distribute the GPS signal to the plurality of devices designed to use this GPS signal as described above, the power divider 110 may be used. Under the assumption that the antenna is connected to the respective devices, unnecessary consumption of the antennas may be encountered. Additionally, under the assumption that the GPS signal is received via only one device and then transmitted to other devices via the received device, an unexpected time delay may occur in a transmission process of the GPS signal. Accordingly, the power divider 110 may be used.

Figure 3:
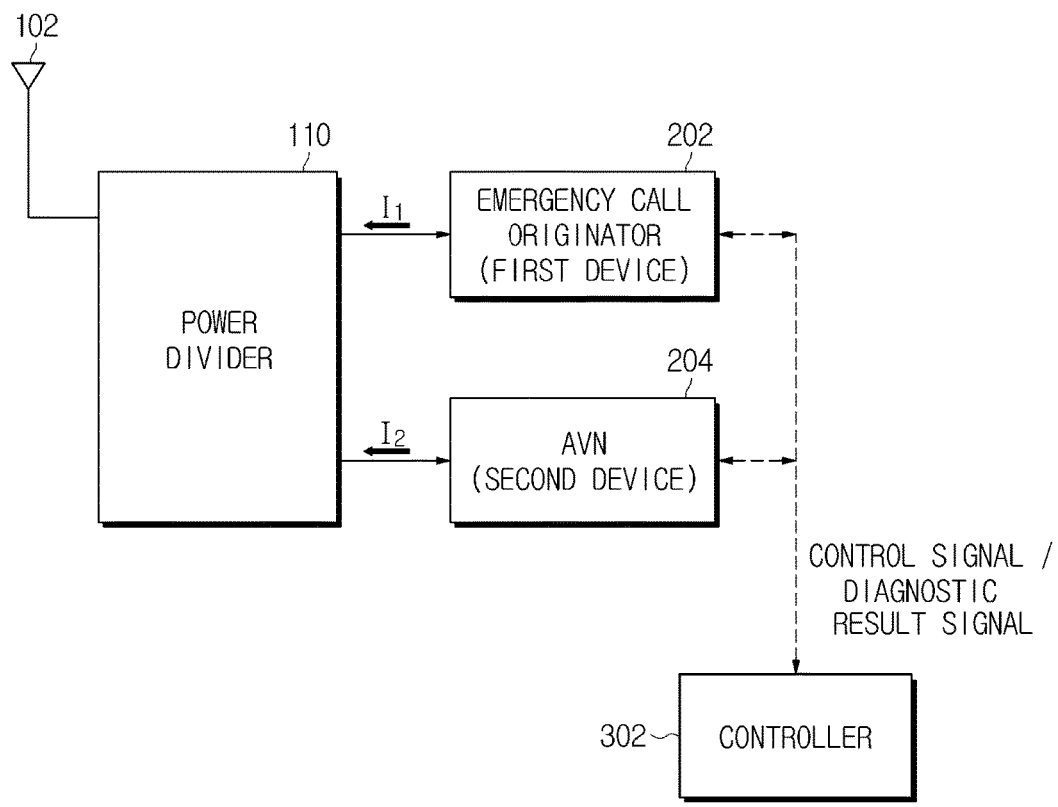
FIG. 3 is a block diagram illustrating a control system for diagnosing normal or abnormal connection of the power divider of the vehicle according to an exemplary embodiment of the present disclosure.

FIG. 3 is a block diagram illustrating a control system for diagnosing normal or abnormal connection of the power divider of the vehicle according to an exemplary embodiment of the present disclosure. Since the connection diagnosis process of the power divider 110 may be achieved in the manufacturing stage of the vehicle 100, a diagnosis process for determining whether the antenna 102, the power divider 110, and the devices 202 and 204 are normally connected (e.g., without connection error) to one another to implement data communication therebetween is required. In the exemplary embodiment, the connection diagnosis process of the power divider may include diagnosing whether the antenna 102, the power divider 110, and the plural devices 202 and 204 are normally connected to one another.

When a control signal for performing connection diagnosis of the power divider is generated from a controller 302 such as an electronic control unit (ECU), and is then applied to the two devices (i.e., the emergency call originator 202 and the AVN unit 204), the emergency call originator 202 and the AVN unit 204 may respectively be configured to distribute a first current signal I1 and a second current signal I2 for connection diagnosis to the power divider 220 upon receiving a control signal from the controller 302. The controller 302 may be configured to receive the results (i.e., the diagnosis result signals) of current signals supplied from the emergency call originator 202 and the AVN unit 204, and thus determine whether the antenna 102, the power divider 110, the emergency call originator 202, and the AVN unit 204 are normally connected to one another based on the received results.

When the antenna 102, the power divider 110, the emergency call originator 202, and the AVN unit 204 are normally connected to one another, it may be assumed that the amount of a rated current flowing from the emergency call originator 202 and the AVN unit 204 to the power divider 110 is in the range of about 5 mA~50 mA. Accordingly, when the amount of a current flowing from the emergency call originator 202 and the AVN unit 204 to the power divider 110 is in the range of about 5 mA~50 mA, the antenna 102, the power divider 110, the emergency call originator 202, and the AVN unit 204 may be determined to be normally connected to one another.

When the amount of a current is set to zero '0', connection between the antenna 102 and the power divider 110 or connection between the power divider 110 and each of two devices (202, 204) is electrically opened, such that no current flows among the antenna 102, the power divider 110, and each device 202 or 204. In addition, assuming that the amount of a current to be applied from the emergency call originator 202 and the AVN unit 204 to the power divider 110 is greater than about 50 mA corresponding to an upper limit of the rated current amount range, electrical connection between the antenna 102 and the power divider 110 may be short-circuited or electrical connection between the power divider 110 and two devices 202 and 204 may be short-circuited, and thus, a current leakage may be detected.

As described above, the exemplary embodiment may determine whether the amount of a current flowing from each of the emergency call originator 202 and the AVN unit 204 to the power divider 110 is within the range of a rated current amount or is beyond the range of the rated current amount to diagnose whether the antenna 102, the power divider 110, the emergency call originator 202, and the AVN unit 204 are normally connected.

Figure 4:
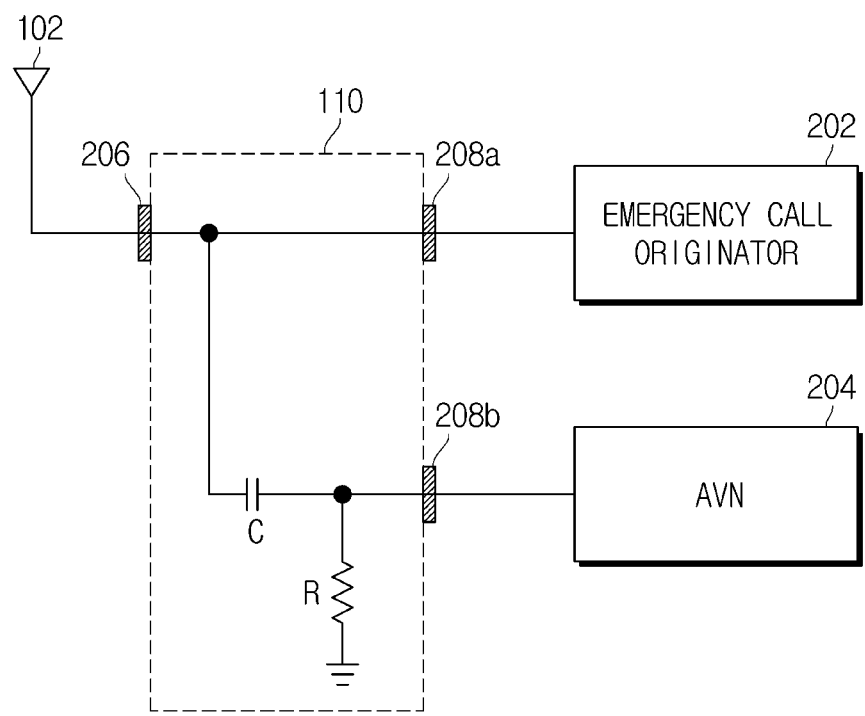
FIG. 4 is a conceptual diagram illustrating a circuit for connection diagnosis contained in the power divider of the vehicle according to an exemplary embodiment of the present disclosure.

FIG. 4 is a conceptual diagram illustrating a circuit for connection diagnosis contained in the power divider of the vehicle according to an exemplary embodiment of the present disclosure. Referring to FIG. 4, the connection diagnosis circuit of the power divider 110 may include a first line that ranges from the emergency call originator 202 to the antenna 102 after passing through the first output terminal 208a and the input terminal 206 of the power divider 110, and a second line that ranges from the AVN unit 204 to the input terminal 206 after passing through the second output terminal 208b of the power divider 110.

The first line and the second line may be constructed in a specific shape in which one line connected to the input terminal is branched into the first line and the second line. By the above-mentioned construction, an input signal received via the input terminal 206 may be branched through the first line and the second line such that the input signal may be distributed to the emergency call originator 202 and the AVN unit 204. In addition, when each of the emergency call originator 202 and the AVN unit 204 outputs a current for connection diagnosis, the current may be applied up to the antenna 102 via the first line, and the current may be applied up to the power divider 110 via the second line.

During a connection diagnosis mode, the first line may operate as a current route that ranges from the emergency call originator 202 to the antenna 102 after passing through the first output terminal 208a and the input terminal 206 of the power divider 110. When a current is applied via the first line to diagnose connection of the power divider 110, assuming that the amount of the applied current is in the rated current amount range, this indicates that the antenna 102, the input terminal 206 and the first output terminal 208a of the power divider 110, and the emergency call originator 202 are normally connected to one another.

During the connection diagnosis mode, the second line may operate as a current route that ranges from the AVN unit 204 to a ground terminal through a resistor R after passing through the second output terminal 208b of the power divider 110. When a current is applied via the second line to diagnose connection of the power divider 110, assuming that the amount of the applied current is in the rated current amount range, this indicates that the second output terminal 208a of the power divider 110 is normally coupled to the emergency call originator 202. The resistor R of the second line may be a shunt resistor, and thus, a current may flow from the AVN unit 204 to the resistor R and connection diagnosis may thus be performed. The resistor R may have resistance of about 330Ω.

A capacitor C connected between the first line and the second line may be a DC block unit. When a current (I2) is applied via the second line ranging from the AVN unit 204 to the power divider 110, the current (I2) may not be applied to the antenna 102 via the first line by the capacitor C operating as the DC block unit. Capacitance of the capacitor C may be about 150 pF. When a connection diagnosis mode is executed by the DC block function of the capacitor C, the first line and the second line may be electrically isolated from each other. However, a GPS signal (implemented as a radio frequency (RF) signal) received via the antenna 102 may pass through the capacitor C such that signal distribution may be normally performed.

Figure 5:
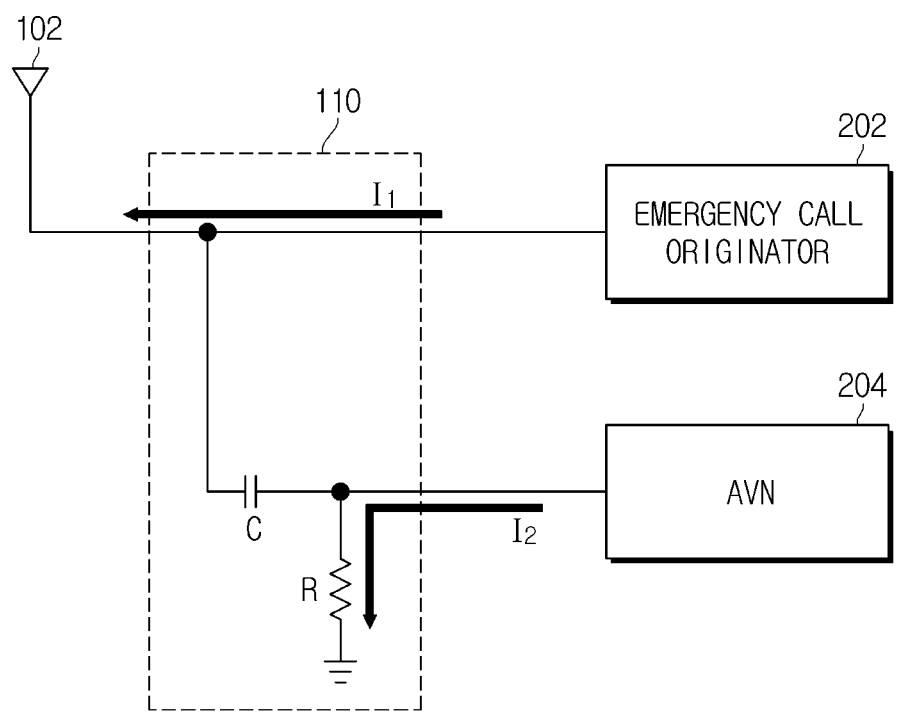
FIG. 5 is a conceptual diagram illustrating a connection diagnosis operation of the power divider of the vehicle according to an exemplary embodiment of the present disclosure.

FIG. 5 is a conceptual diagram illustrating a connection diagnosis operation of the power divider of the vehicle according to an exemplary embodiment of the present disclosure. The current (I1) received from the emergency call originator 202 in response to a control signal (see FIG. 3) required to perform connection diagnosis of the power divider 110 may be applied to the antenna 102 through the power divider 110. In other words, assuming that the current (I1) received from the emergency call originator 202 is applied to the antenna 102 via the first line ranging from the first output terminal 208a to the input terminal 206 of the power divider 110, the emergency call originator 202, the power divider 110, and the antenna 102 may be determined to be normally connected through a current received from the emergency call originator 202.

Simultaneous with the above-mentioned diagnosis operation, the current (I2) received from the AVN unit 204 in response to a control signal (see FIG. 3) for connection diagnosis of the power divider 110 may be transferred up to the power divider 110. In other words, under the assumption that the current (I2) received from the AVN unit 204 is applied to the power divider 110, the AVN unit 204 and the power divider 110 may be determined to be normally connected to each other in response to receiving a current from the AVN unit 204. As previously stated with regards to FIG. 4, the current (I2) flowing from the AVN unit 204 to the power divider 110 may not be applied to the antenna 102 according to the DC block operation of the capacitor C. Information regarding whether connection between the antenna 102 and the power divider 110 is achieved may be confirmed through a current received from the emergency call originator 202. Since connection or disconnection between the AVN unit 204 and the power divider 110 may be determined through the current received from the AVN unit 204, connection diagnosis among the antenna 102, the power divider 110, the emergency call originator 202, and the AVN unit 204 may be achieved.

Figure 6:
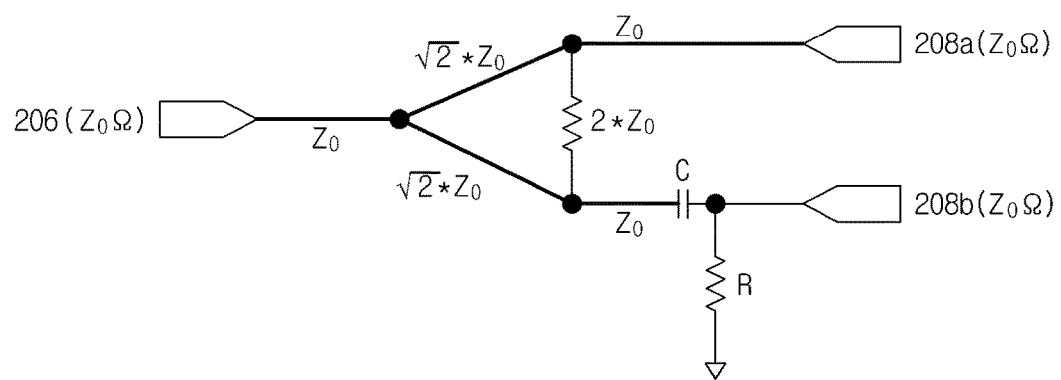
FIG. 6 is an equivalent circuit illustrating the power divider shown in FIG. 4 according to an exemplary embodiment of the present disclosure.

FIG. 6 is an equivalent circuit illustrating the power divider shown in FIG. 4. In FIG. 6, under the assumption that characteristic impedance is about 50Ω, load of about 50Ω may be applied to each of the output terminals (208a, 208b) from the viewpoint of the input terminal 206 disposed to face the output terminals (208a, 208b). Therefore, under the assumption that a transmission line is not present between the input terminal 206 and the output terminals (208a, 208b), a 2-way line may be implemented, and thus, impedance of each output terminal 208a or 208b may be considered to be about 25Ω. In particular, when a transmission line is inserted between the input terminal 206 and the first output terminal 208a, the 100Ω to 50Ω impedance conversion circuit may be constructed (e.g., about 70.7Ω). From the viewpoint of the input terminal 206 facing the output terminals (208a, 208b), one impedance component of about 100Ω may be connected in parallel to the other impedance component of about 100Ω, resulting in acquisition of about 50Ω. As a result, impedance matching between the input terminal 206 and each output terminal 208a or 208b may be achieved.

When the current (I1) received from the emergency call originator 202 via the first output terminal 208a to diagnose connection of the power divider 110 is applied to the antenna 102 via the input terminal 206, the emergency call originator 202, the power divider 110, and the antenna 102 may be determined to be normally connected to one another. Simultaneous with the above-mentioned operation, the current (I2) received from the AVN unit 204 via the second output terminal 208b to perform connection diagnosis of the power divider 110 may not be applied to the input terminal 206 by the DC block operation of the capacitor C, and the current (I2) may flow to the ground terminal through the resistor R, to determine that the AVN unit 204 and the power divider 110 are normally connected to each other.

Figure 7:
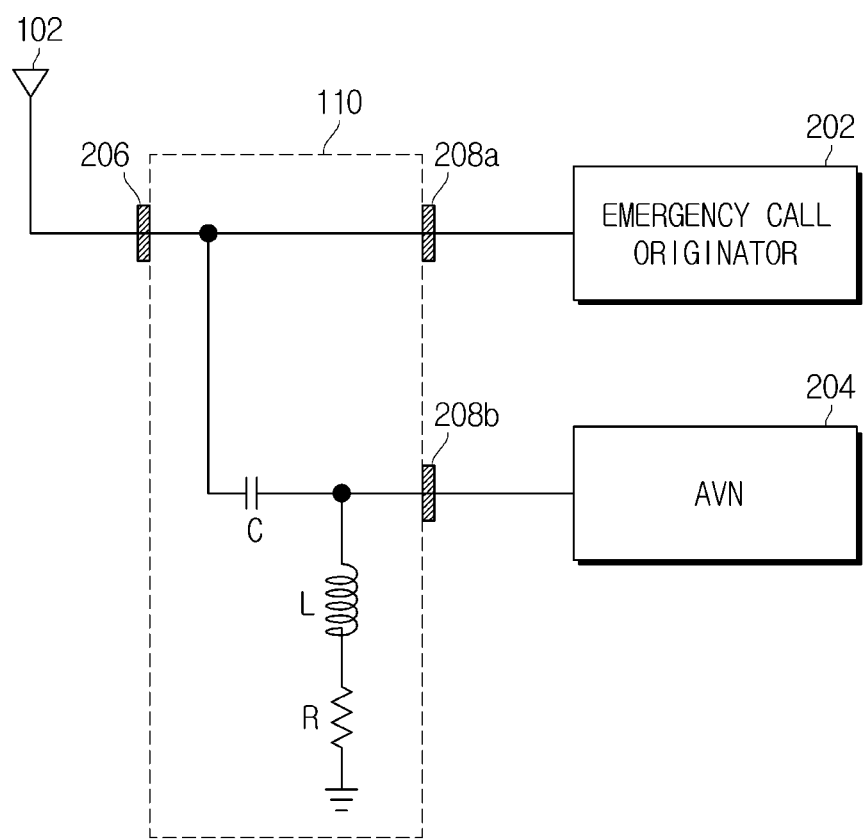
FIG. 7 is a conceptual diagram illustrating a connection diagnosis circuit embedded in a power divider of a vehicle according to another exemplary embodiment of the present disclosure.

FIG. 7 is a conceptual diagram illustrating a connection diagnosis circuit embedded in a power divider of a vehicle according to another exemplary embodiment of the present disclosure. Referring to FIG. 7, the connection diagnosis circuit of the power divider 110 may include a first line that ranges from the emergency call originator 202 to the antenna 102 after passing through the first output terminal 208a and the input terminal 206 of the power divider 110, and a second line that ranges from the AVN unit 204 to the input terminal 206 after passing through the second output terminal 208b of the power divider 110.

The first line and the second line may be constructed in a specific shape in which one line connected to the input terminal is branched into the first line and the second line. By the above-mentioned construction, an input signal received through the input terminal 206 may be branched through the first line and the second line such that the input signal may be distributed to the emergency call originator 202 and the AVN unit 204. In contrast, when each of the emergency call originator 202 and the AVN unit 204 outputs a current for connection diagnosis, the current may be applied up to the antenna 102 via the first line, and the current may be applied up to the power divider 110 via the second line.

During a connection diagnosis mode, the first line may operate as a current route that ranges from the emergency call originator 202 to the antenna 102 after passing through the first output terminal 208a and the input terminal 206 of the power divider 110. When a current is applied through the first line to diagnose connection of the power divider 110, under the assumption that the amount of the applied current is in the rated current amount range, this indicates that the antenna 102, the input terminal 206 and the first output terminal 208a of the power divider 110, and the emergency call originator 202 are normally connected to one another.

During the connection diagnosis mode, the second line may operate as a current route that ranges from the AVN unit 204 to a ground terminal through a resistor R after passing through the second output terminal 208b of the power divider 110. When a current is applied via the second line to diagnose connection of the power divider 110, under the assumption that the amount of the applied current is in the rated current amount range, this indicates that the second output terminal 208a of the power divider 110 is normally coupled to the emergency call originator 202.

When the GPS signal implemented as the RF signal is received, an inductor L connected in series to the resistor R is an RF choke configured to prevent loss of the RF signal caused by the resistor R. In other words, the inductor L may be configured to prevent the RF signal from leaking to the ground terminal through the resistor R, to thus prevent RF loss caused by the resistor R. From the viewpoint of the GPS signal of about 1.575 GHz, under the assumption that the resistor R has resistance of about 1 kΩ, RF loss of about 0.3 dB may occur. When the resistor R has resistance of about 500Ω, RF loss of about 0.6 dB may occur. When the inductor L operating as the RF choke is connected to an upper part of the resistor R as shown in FIG. 7, RF loss caused by the resistor R may be prevented. The resistor R of the second line may operate as a shunt resistor, and thus, a current may flow from the AVN unit 204 to the resistor R and connection diagnosis may thus be performed. The resistor R may have resistance of about 330Ω.

A capacitor C connected between the first line and the second line may be a DC block unit. When a current (I2) is applied via the second line ranging from the AVN unit 204 to the power divider 110, the current (I2) may not be applied to the antenna 102 via the first line by the capacitor C acting as the DC block unit. Capacitance of the capacitor C may be about 150 pF. When a connection diagnosis mode is executed by the DC block function of the capacitor C, the first line and the second line may be electrically isolated from each other. However, a GPS signal (RF signal) received via the antenna 102 may pass through the capacitor C and thus, signal distribution may be normally performed.

Figure 8:
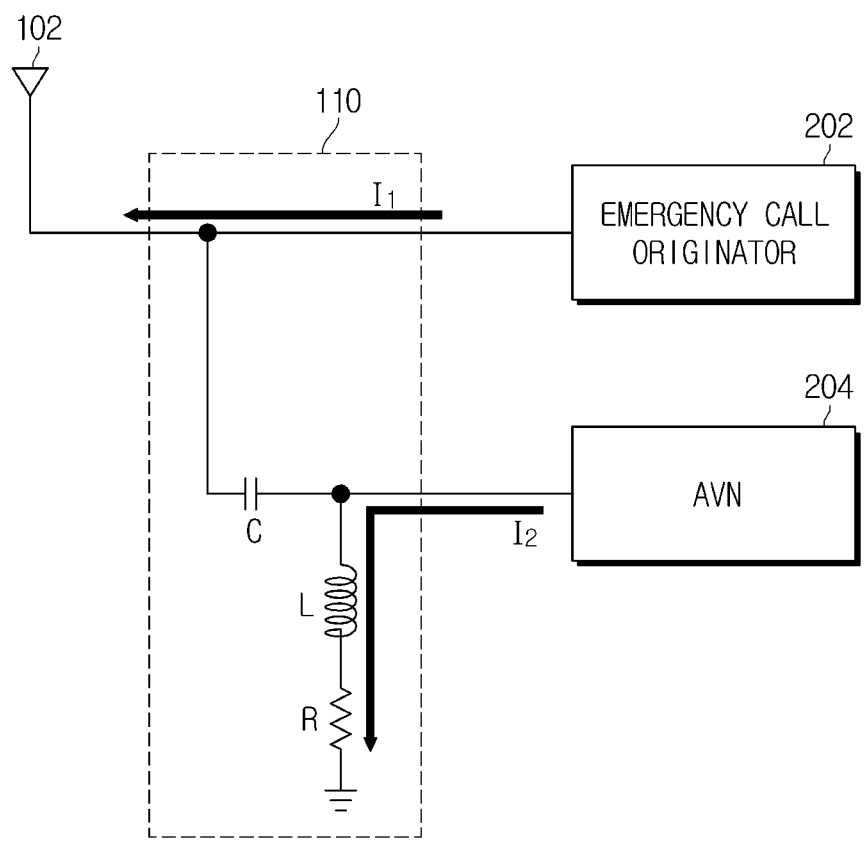
FIG. 8 is a conceptual diagram illustrating a connection diagnosis operation of the power divider of the vehicle according to another exemplary embodiment of the present disclosure.

FIG. 8 is a conceptual diagram illustrating a connection diagnosis operation of the power divider of the vehicle according to another exemplary embodiment of the present disclosure. Referring to FIG. 8, the current (I1) received from the emergency call originator 202 in response to a control signal (see FIG. 3) required to perform connection diagnosis of the power divider 110 may be applied to the antenna 102 through the power divider 110. In other words, under the assumption that the current (I1) received from the emergency call originator 202 is applied to the antenna 102 via the first line ranging from the first output terminal 208a to the input terminal 206 of the power divider 110, the emergency call originator 202, the power divider 110, and the antenna 102 may be determined to be normally connected through a current received from the emergency call originator 202.

Simultaneous with the above-mentioned diagnosis operation, the current (I2) received from the AVN unit 204 in response to a control signal (see FIG. 3) for connection diagnosis of the power divider 110 may be transferred up to the power divider 110. In other words, assuming that the current (I2) received from the AVN unit 204 is applied to the power divider 110, the AVN unit 204 and the power divider 110 may be determined to be normally connected to each other in response to receiving a current from the AVN unit 204. As previously stated in FIG. 7, the current (I2) flowing from the AVN unit 204 to the power divider 110 may not be applied to the antenna 102 according to the DC block operation of the capacitor C. In addition, the inductor connected in series to the resistor R may be configured to prevent the RF signal from leaking to the ground terminal through the resistor R, and thus, RF loss caused by the resistor R may be prevented.

Information regarding whether connection between the antenna 102 and the power divider 110 is achieved may be confirmed through a current received from the emergency call originator 202. Since connection or disconnection between the AVN unit 204 and the power divider 110 may be determined through the current received from the AVN unit 204, connection diagnosis among the antenna 102, the power divider 110, the emergency call originator 202, and the AVN unit 204 may be determined to be achieved.

Figure 9:
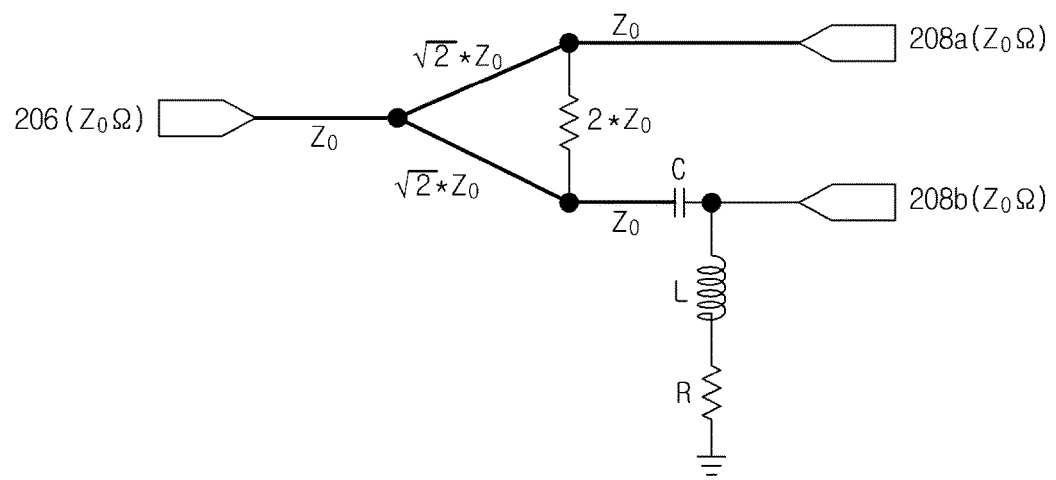
FIG. 9 is an equivalent circuit illustrating the power divider shown in FIG. 7 according to another exemplary embodiment of the present disclosure.

FIG. 9 is an equivalent circuit illustrating the power divider shown in FIG. 7. In FIG. 9, under the assumption that characteristic impedance is about 50Ω, load of about 50Ω may be applied to each of the output terminals (208a, 208b) from the viewpoint of the input terminal 206 facing the output terminals (208a, 208b). Therefore, under the assumption that a transmission line is not present between the input terminal 206 and the output terminals (208a, 208b), a 2-way line may be implemented, and thus, impedance of each output terminal 208a or 208b may be considered to be about 25Ω. In particular, when a transmission line is inserted between the input terminal 206 and the first output terminal 208a, the 100Ω to 50Ω impedance conversion circuit may be constructed (e.g., about 70.7Ω).

From the viewpoint of the input terminal 206 facing the output terminals (208a, 208b), a first impedance component of about 100Ω may be connected in parallel to a second impedance component of about 100Ω, resulting in acquisition of about 50Ω. As a result, impedance matching between the input terminal 206 and each output terminal 208a or 208b may be achieved. When the current (I1) received from the emergency call originator 202 through the first output terminal 208a to diagnose connection of the power divider 110 is applied to the antenna 102 through the input terminal 206, the emergency call originator 202, the power divider 110, and the antenna 102 may be determined to be normally connected to one another.

Simultaneous with the above-mentioned operation, the current (I2) received from the AVN unit 204 through the second output terminal 208b to perform connection diagnosis of the power divider 110 is not applied to the input terminal 206 by the DC block operation of the capacitor C, and the current (I2) flows to the ground terminal through the inductor L and the resistor R connected in series to each other, and thus, the AVN unit 204 and the power divider 110 may be determined to be normally connected to each other.

Figure 10:
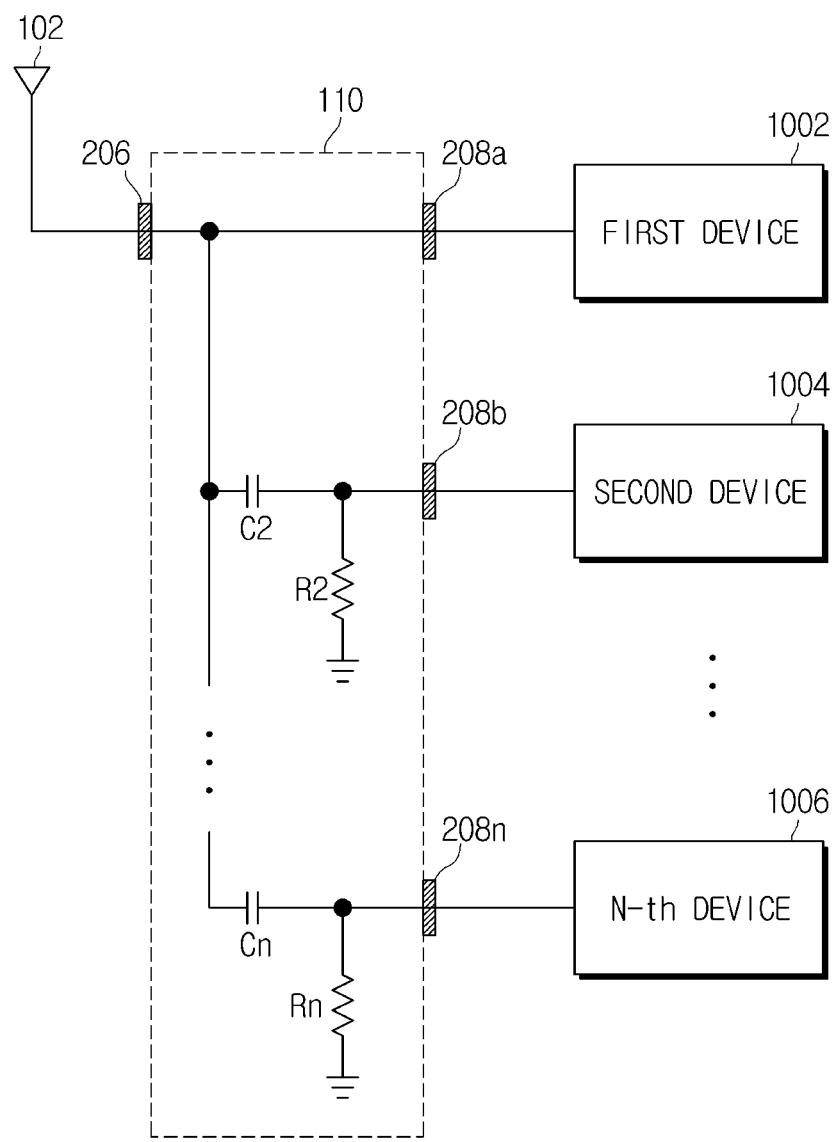
FIG. 10 is a conceptual diagram illustrating a connection diagnosis circuit embedded in a power divider of a vehicle according to still another exemplary embodiment of the present disclosure.

FIG. 10 is a conceptual diagram illustrating a connection diagnosis circuit embedded in a power divider of a vehicle according to still another exemplary embodiment of the present disclosure. In FIG. 10, the power divider 110 may be an N-way distributor including N output terminals. Referring to FIG. 10, the connection diagnosis circuit of the power divider 110 may include a first line that ranges from a first device 102 corresponding to one of the plurality of devices (1002, 1004, 1006) to the antenna 102 after passing through the power divider 110, and a plurality of second lines that range from each of a second device 1004 and the N-th device 1006 corresponding to the remaining devices from among the plurality of devices (1002, 1004, 1006) to the input terminal 206 after passing through the second output terminal 208b of the power divider 110. Each device 1002, 1004, or 1006 may be configured to receive the GPS signal via the antenna 102, and may be designed to perform given functions using the received GPS signal.

The first line and the plurality of second lines may be constructed in a specific shape in which one line connected to the input terminal is branched into the first line and the second line. By the above-mentioned construction, an input signal received via the input terminal 206 may be branched through the first line and each second line and thus, the input signal may be distributed to the plurality of devices (1002, 1004, 1006). In contrast, when each of the emergency call originator 202 and the AVN unit 204 outputs a current for connection diagnosis, the current may be applied up to the antenna 102 via the first line, and the current may be applied up to the power divider 110 via the second lines.

During a connection diagnosis mode, the first line may operate as a current route that ranges from the first device 1002 to the antenna 102 after passing through the first output terminal 208a and the input terminal 206 of the power divider 110. When a current is applied via the first line to diagnose connection of the power divider 110, under the assumption that the amount of the applied current is in the rated current amount range, this indicates that the antenna 102, the input terminal 206 and the first output terminal 208a of the power divider 110, and the first device 1002 are normally connected to one another.

During the connection diagnosis mode, the second line may operate as a current route that ranges from the second device 1004 to a ground terminal through a resistor R after passing through the second output terminal 208b of the power divider 110. When a current is applied via the second line to diagnose connection of the power divider 110, under the assumption that the amount of the applied current is in the rated current amount range, this indicates that the second output terminal 208a of the power divider 110 is normally coupled to the second device 1004. A resistor R2 of the second line may be a shunt resistor, and thus, a current may flow from the second device 1004 to the resistor R2 and connection diagnosis may thus be performed. The resistor R2 may have resistance of about 330Ω.

Further, a capacitor C2 connected between the first line and the second line may be a DC block unit. When a current (I2) is applied via the second line ranging from the second device 1002 to the power divider 110, the current (I2) may not be applied to the antenna 102 via the first line by the capacitor C operating as the DC block unit. Capacitance of the capacitor C2 may be about 150 pF. When a connection diagnosis mode is executed by the DC block function of the capacitor C2, the first line and the second line may be electrically isolated from each other. However, the GPS signal (RF signal) received via the antenna 102 may pass through the capacitor C2 and thus, signal distribution may be normally performed.

In the same manner as in the second device 1004, the N-th device 1006 may also be connected to the power divider 110 via another second line. The resistor Rn of the above second line configured to interconnect the N-th device 1006 and the power divider 110 may be a shunt resistor, and thus, a current may flow from the N-th device 1006 to the resistor Rn and connection diagnosis may thus be achieved. The resistor Rn may have resistance of about 330Ω.

A capacitor Cn connected between the first line and the second line may be a DC block unit. When a current (I2) is applied via the second line ranging from the N-th device 1006 to the power divider 110, the current (I2) may not be applied to the antenna 102 via the first line by the capacitor Cn operating as the DC block unit. Capacitance of the capacitor Cn may be about 150 pF. When a connection diagnosis mode is executed by the DC block function of the capacitor Cn, the first line and the second line may be electrically isolated from each other. However, a GPS signal (RF signal) received via the antenna 102 may pass through the capacitor Cn and thus, signal distribution may be normally performed.

Figure 11:
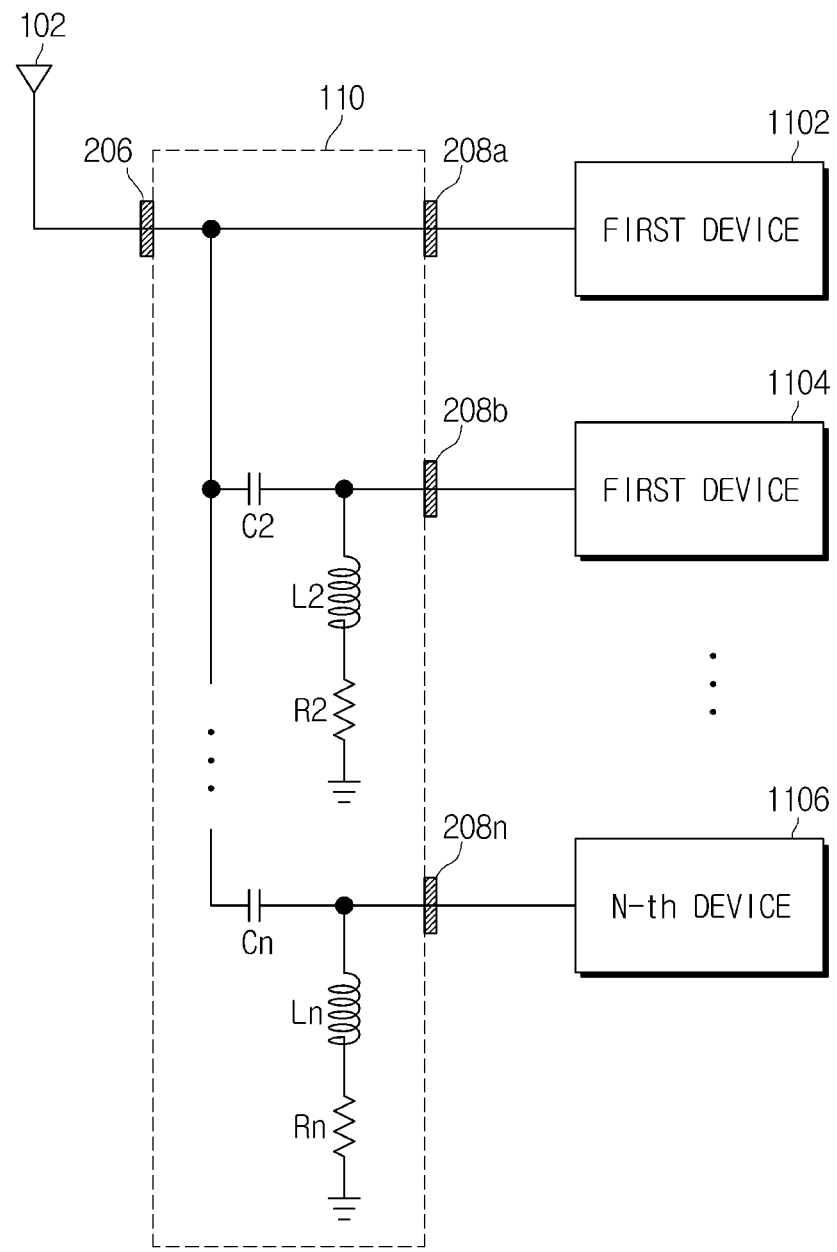
FIG. 11 is a conceptual diagram illustrating a connection diagnosis circuit embedded in a power divider of a vehicle according to still another exemplary embodiment of the present disclosure.

FIG. 11 is a conceptual diagram illustrating a connection diagnosis circuit embedded in a power divider of a vehicle according to still another exemplary embodiment of the present disclosure. In FIG. 11, the power divider 110 may be an N-way distributor including N output terminals. Referring to FIG. 11, the connection diagnosis circuit of the power divider 110 may include a first line that ranges from a first device 1102 corresponding to one of the plurality of devices (1102, 1104, 1106) to the antenna 102 after passing through the power divider 110, and a plurality of second lines that range from each of a second device 1104 and the N-th device 1106 corresponding to the remaining devices from among the plurality of devices (1102, 1104, 1106) to the input terminal 206 after passing through the second output terminal 208b of the power divider 110. Each device 1102, 1104, or 1106 may be configured to receive the GPS signal via the antenna 102, and may be designed to perform given functions using the received GPS signal.

The first line and the plurality of second lines may be constructed in a specific shape in which one line connected to the input terminal is branched into the first line and the plurality of second lines. By the above-mentioned construction, an input signal received via the input terminal 206 may be branched through the first line and each of the second lines and thus, the input signal may be distributed to the plurality of devices (1102, 1104, 1106). In contrast, when each of the two devices 1102 and 1104 outputs a current for connection diagnosis, the current may be applied up to the antenna 102 via the first line, and the current may be applied up to the power divider 110 via the plurality of second lines.

During a connection diagnosis mode, the first line may operate as a current route that ranges from the first device 1102 to the antenna 102 after passing through the first output terminal 208a and the input terminal 206 of the power divider 110. When a current is applied via the first line to diagnose connection of the power divider 110, under the assumption that the amount of the applied current is in the rated current amount range, this indicates that the antenna 102, the input terminal 206 and the first output terminal 208a of the power divider 110, and the first device 1102 are normally connected to one another. Additionally, during the connection diagnosis mode, the second line may operate as a current route that ranges from the second device 1004 to a ground terminal through the inductor L2 and the resistor R2 connected in series to each other after passing through the second output terminal 208b of the power divider 110. When a current is applied via the second line, under the assumption that the amount of the applied current is in the rated current amount range, this indicates that the second output terminal 208a of the power divider 110 is normally coupled to the second device 1104.

When the GPS signal implemented as the RF signal is received, an inductor L2 connected in series to the resistor R2 is an RF choke configured to prevent loss of the RF signal caused by the resistor R2. In other words, the inductor L may be configured to prevent the RF signal from leaking to the ground terminal through the resistor R2, thus preventing RF loss caused by the resistor R2 from occurring. From the viewpoint of the GPS signal of about 1.575 GHz, under the assumption that the resistor R2 has resistance of about 1 kΩ, RF loss of about 0.3 dB may occur. When the resistor R2 has resistance of about 500Ω, RF loss of about 0.6 dB may occur. When the inductor L2 operating as the RF choke is connected to an upper part of the resistor R2 as shown in FIG. 11, RF loss caused by the resistor R2 may be prevented. The resistor R2 of the second line may operate as a shunt resistor, and thus, a current may flow from the second device 1104 to the resistor R2 and connection diagnosis may thus be performed. The resistor R2 may have resistance of about 330Ω.

A capacitor C2 connected between the first line and the second line may be a DC block unit. When a current (I2) is applied via the second line ranging from the second device 1104 to the power divider 110, the current (I2) may not be applied to the antenna 102 via the first line by the capacitor C2 operating as the DC block unit. Capacitance of the capacitor C2 may be about 150 pF. When a connection diagnosis mode is executed by the DC block function of the capacitor C2, the first line and the second line may be electrically isolated from each other. However, a GPS signal (RF signal) received via the antenna 102 may pass through the capacitor C and thus, signal distribution may be normally performed. In the same manner as in the second device 1104, the N-th device 1106 may also be connected to the power divider 110 via another second line.

In addition, the inductor L connected in series to the resistor R on the second line for connecting the N-th device 1106 to the power divider 110 may prevent the RF signal from leaking to the ground terminal through the resistor R, and thus, RF loss caused by the resistor R may be prevented. The resistor Rn of the second line for connecting the N-th device 1106 to the power divider 110 may operate as a shunt resistor, and thus, a current may flow from the N-th device 1106 to the resistor Rn and connection diagnosis may thus be performed. The resistor R2 may have resistance of about 330Ω.

A capacitor Cn connected between the first line and the second line may be a DC block unit. When a current (I2) is applied through the second line ranging from the N-th device 1106 to the power divider 110, the current (I2) may not be applied to the antenna 102 via the first line by the capacitor Cn operating as the DC block unit. Capacitance of the capacitor Cn may be about 150 pF. When a connection diagnosis mode is executed by the DC block function of the capacitor Cn, the first line and the second line may be electrically isolated from each other. However, a GPS signal (RF signal) received via the antenna 102 may pass through the capacitor Cn and thus, signal distribution may be normally performed.

As is apparent from the above description, the power divider according to the exemplary embodiments may diagnose whether various elements connected to input and output (I/O) terminals of the power divider are normally and correctly connected to the power divider. Although a few exemplary embodiments of the present disclosure have been shown and described, it would be appreciated by those skilled in the art that changes may be made in these exemplary embodiments without departing from the principles and spirit of the invention, the scope of which is defined in the claims and their equivalents.

What is claimed is:

1. A power divider, comprising:
   an input terminal connected to an antenna;
   a first output terminal connected to the input terminal via a first line to output a signal;
   a second output terminal connected to the input terminal via a second line to output the signal;
   a resistor configured to allow a current flowing to the second line via the second output terminal to be applied to a ground terminal; and
   a capacitor disposed on the second line to prevent the current applied to the second line from flowing to the first line,
   wherein the current is applied to the first line via a first unit connected to the first output terminal to diagnose a connection state among the antenna, the first line, and the first unit, and
   wherein the current is applied to the second line via a second unit connected to the second output terminal to diagnose a connection state between the second line and the second unit.

2. The power divider according to claim 1, further comprising:
   an inductor connected in series to the resistor.

3. The power divider according to claim 1, wherein the current is a direct current (DC).

4. The power divider according to claim 1, wherein the antenna is configured to receive a Global Positioning System (GPS) signal.

5. The power divider according to claim 1, wherein the first unit is an emergency call origination unit.

6. The power divider according to claim 1, wherein the second unit is a multimedia unit.

7. A power divider, comprising:
an input terminal connected to an antenna;
a first output terminal connected to the input terminal via a first line to output a signal;
a second output terminal connected to the input terminal via a second line to output the signal;
a resistor configured to allow a current flowing to the second line via the second output terminal to be applied to a ground terminal; and
an inductor connected in series to the resistor;
a capacitor disposed on the second line to prevent the current applied to the second line from flowing to the first line,
wherein the current is applied to the first line via an emergency call origination unit connected to the first output terminal to diagnose a connection state among the antenna, the first line, and the emergency call origination unit, and
wherein the current is applied to the second line via a multimedia unit connected to the second output terminal to diagnose a connection state between the second line and the multimedia unit.

* * * * *